US012604571B2

(12) United States Patent
Chadda

(10) Patent No.:  US 12,604,571 B2
(45) Date of Patent:      Apr. 14, 2026

(54) LIGHT EMITTING DIODES WITH LATTICE MATCHING SIDEWALL PASSIVATION LAYER AND METHOD OF MAKING THEREOF

(71) Applicant: SAMSUNG ELECTRONICS CO., LTD., Suwon-si (KR)

(72) Inventor: Saket Chadda, San Jose, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 635 days.

(21) Appl. No.: 17/937,878

(22) Filed: Oct. 4, 2022

(65) Prior Publication Data

US 2023/0113198 A1      Apr. 13, 2023

Related U.S. Application Data

(60) Provisional application No. 63/253,225, filed on Oct. 7, 2021.

(51) Int. Cl.
| | |
|---|---|
| *H10H 20/84* | (2025.01) |
| *H10H 20/01* | (2025.01) |
| *H10H 20/821* | (2025.01) |
| *H10H 20/824* | (2025.01) |
| *H10H 20/825* | (2025.01) |
| *H10H 20/833* | (2025.01) |
| *H10H 20/841* | (2025.01) |
| *H10H 20/857* | (2025.01) |

(52) U.S. Cl.
CPC ........ *H10H 20/84* (2025.01); *H10H 20/0133* (2025.01); *H10H 20/01335* (2025.01); *H10H 20/821* (2025.01); *H10H 20/824* (2025.01);
*H10H 20/825* (2025.01); *H10H 20/833* (2025.01); *H10H 20/841* (2025.01); *H10H 20/857* (2025.01); *H10H 20/032* (2025.01); *H10H 20/034* (2025.01); *H10H 20/0364* (2025.01)

(58) Field of Classification Search
CPC ......... H10H 20/0133; H10H 20/01335; H10H 20/824; H10H 20/833; H10H 20/812
See application file for complete search history.

(56) References Cited

U.S. PATENT DOCUMENTS

| | | | |
|---|---|---|---|
| 7,656,010 | B2 | 2/2010 | Murata et al. |
| 8,686,454 | B2 | 4/2014 | Choi et al. |
| 8,865,489 | B2 | 10/2014 | Rogers et al. |
| 9,368,939 | B2 | 6/2016 | McLaurin et al. |

(Continued)

FOREIGN PATENT DOCUMENTS

JP        2009-239294 A     10/2009

*Primary Examiner* — Davienne N Monbleau
*Assistant Examiner* — Emily Farmer
(74) *Attorney, Agent, or Firm* — Sughrue Mion, PLLC

(57)      ABSTRACT

A light emitting diode includes a mesa structure containing a first-conductivity-type compound semiconductor layer, an active layer stack configured to emit light at a peak wavelength, and a second-conductivity-type compound semiconductor layer, and a passivation material layer contacting at least a sidewall of the mesa structure. The passivation material layer has a first crystal structure that matches a second crystal structure of the first-conductivity-type compound semiconductor layer and the second-conductivity-type compound semiconductor layer.

16 Claims, 12 Drawing Sheets

1200

(56) References Cited

U.S. PATENT DOCUMENTS

| | | | |
|---|---|---|---|
| 10,002,928 B1 | 6/2018 | Raring et al. | |
| 10,217,897 B1* | 2/2019 | Ma | H10H 20/825 |
| 10,998,465 B2 | 5/2021 | Danesh et al. | |
| 2017/0170360 A1* | 6/2017 | Bour | H10H 20/84 |
| 2020/0075803 A1* | 3/2020 | Danesh | H10H 20/833 |

* cited by examiner

100

700

LIGHT EMITTING DIODES WITH LATTICE MATCHING SIDEWALL PASSIVATION LAYER AND METHOD OF MAKING THEREOF

FIELD

This disclosure relates to light emitting devices, and particularly to light emitting diodes including sidewall passivation layers and methods of fabricating the same.

BACKGROUND

Light emitting devices are used in electronic displays, such as backlights in liquid crystal displays located in laptops or televisions. Light emitting devices include light emitting diodes (LEDs) and various other types of electronic devices configured to emit light.

For light emitting devices, such as light emitting diodes (LED), the emission wavelength is determined by the band gap of the active region of the LED together with thickness determined confinement effects. Often the active region includes one or more bulk semiconductor layers or quantum wells (QW). For III-nitride based LED devices, such as GaN based devices, the active region (e.g., bulk semiconductor layer or QW well layer) material may be ternary, such as $In_xGa_{1-x}N$, where $0<x<1$.

The band gap of such III-nitride materials is dependent on the amount of In incorporated in the active region. Higher indium incorporation will yield a smaller band gap and thus longer wavelength of the emitted light. As used herein, the term "wavelength" refers to the peak emission wavelength of the LED. It should be understood that a typical emission spectra of a semiconductor LED is a narrow band of wavelength centered around the peak wavelength.

SUMMARY

According to an embodiment of this disclosure, a light emitting diode includes a mesa structure containing a first-conductivity-type compound semiconductor layer, an active layer stack configured to emit light at a peak wavelength, and a second-conductivity-type compound semiconductor layer, and a passivation material layer contacting at least a sidewall of the mesa structure. The passivation material layer has a first crystal structure that matches a second crystal structure of the first-conductivity-type compound semiconductor layer and the second-conductivity-type compound semiconductor layer.

According to another embodiment of this disclosure, a method of forming a light emitting diode comprises forming a first-conductivity-type compound semiconductor layer, an active layer stack configured to emit light at a peak wavelength, a second-conductivity-type compound semiconductor layer over a substrate, forming a mesa structure by etching the first-conductivity-type compound semiconductor layer, the active layer stack and the second-conductivity-type compound semiconductor layer, and forming a passivation material layer in contact with at least a sidewall of the mesa structure, wherein the passivation material layer comprises a first crystal structure that matches a second crystal structure of the first-conductivity-type compound semiconductor layer and the second-conductivity-type compound semiconductor layer.

DETAILED DESCRIPTION

A display device, such as a direct view display may be formed from an ordered array of pixels. Each pixel may include a set of subpixels that emit light at a respective peak wavelength. For example, a pixel may include a red subpixel, a green subpixel, and a blue subpixel. Each subpixel may include one or more light emitting diodes that emit light of a particular wavelength. A traditional arrangement is to have red, green, and blue (RGB) subpixels within each pixel. Each pixel is driven by a backplane circuit such that any combination of colors within a color gamut may be shown on the display for each pixel. The display panel may be formed by a process in which LED subpixels are soldered to, or otherwise electrically attached to, a bond pad located on a backplane. The bond pad is electrically driven by the backplane circuit and other driving electronics.

Figure 1:
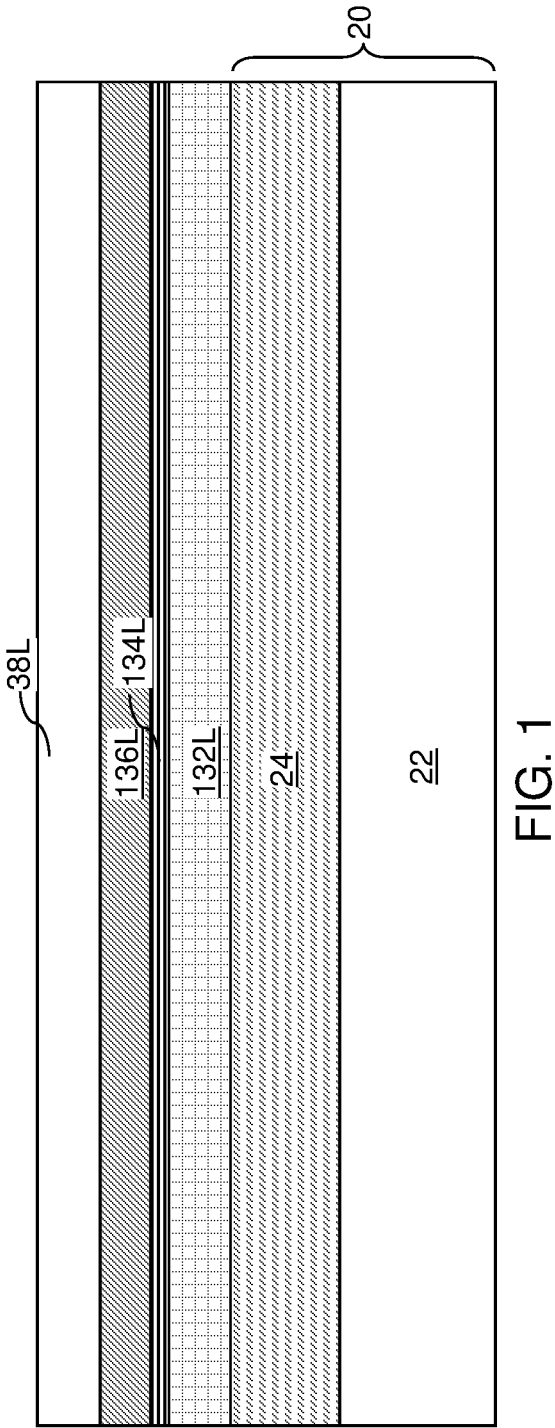
FIG. 1 is a vertical cross-sectional view of an intermediate structure that may be used in the formation of planar LED structures, according to various embodiments.

FIG. 1 is a vertical cross-sectional view of an intermediate structure 100 that may be used in the formation of planar LED structures, according to various embodiments. The intermediate structure 100 includes a support substrate 22 and a buffer layer 24. The buffer layer 24 may be a doped single crystalline compound semiconductor layer such as a doped single crystalline III-V compound semiconductor layer (e.g., a n-doped single crystalline GaN layer). The buffer layer 24 may have a doping of a first conductivity type, which may be p-type or n-type. The support substrate 22 may be any single crystalline substrate (such as a single crystalline sapphire substrate) that may function as an epitaxial growth template for the buffer layer 24. In one embodiment, the interface between the support substrate 22 and the buffer layer 24 may be planar or non-planar (e.g., the interface may be textured if the support substrate includes a patterned sapphire substrate (PSS)).

A layer stack including a continuous first-conductivity-type semiconductor material layer 132L, a continuous active layer 134L, a continuous second-conductivity-type semiconductor material layer 136L, and a continuous transparent conductive oxide layer 38L, may be sequentially formed over the buffer layer 24. Each layer within the layer stack may be formed as a blanket material layer having a uniform thickness and continuously extending over the entire area of the buffer layer 24. As used herein, a "continuous" element refers to a unitary element that extends continuously between each segment of the element without a discontinuity.

The continuous first-conductivity-type semiconductor material layer 132L includes a doped single crystalline compound semiconductor material having a doping of the first conductivity type, i.e., the conductivity type of doping of the buffer layer 24. The material of the continuous first-conductivity-type semiconductor material layer 132L may be the same as, or may be different from, the material of the buffer layer 24, and may be epitaxially aligned to the material of the buffer layer 24. In one embodiment, the material of the continuous first-conductivity-type semiconductor material layer 132L may be selected to match the average lattice constant of the material layers to be subsequently employed in the continuous active layer 134L, and to reduce mechanical stress within the continuous active layer 134L. For example, the material of the continuous first-conductivity-type semiconductor material layer 132L may include n-type gallium nitride. In one embodiment, the first conductivity type may be n-type. In another embodiment, the first conductivity type may be p-type. The epitaxial growth process that grows the continuous first-conductivity-type semiconductor material layer 132L may be selective or non-selective.

The continuous active layer 134L includes at least one semiconductor material that emits light upon application of a suitable electrical bias. For example, the continuous active layer 134L may include a single or a multi-quantum well (MQW) structure that emits light upon application of an electrical bias thereacross. For example, the quantum well(s) may include indium gallium nitride well(s) located between gallium nitride or aluminum gallium nitride barrier layers. Alternatively, the continuous active layer 134L may include any other suitable semiconductor layers or stack of layers for light emitting diode applications. The continuous active layer 134L may be configured to emit any color light, such as blue, green or red light.

The continuous second-conductivity-type semiconductor material layer 136L may include a compound semiconductor material having a doping of the second conductivity type. The compound semiconductor material of the second-conductivity-type semiconductor material layer 136L may be any suitable semiconductor material, such as p-type gallium nitride or aluminum gallium nitride. For example, the first-conductivity-type semiconductor material layer 132L may include n-doped GaN, and the second-conductivity-type semiconductor material layer 136L may include p-doped GaN.

The continuous transparent conductive oxide layer 38L may include a transparent conductive oxide material, such as indium tin oxide or aluminum doped zinc oxide. The transparent conductive oxide layer 38L may be deposited as a continuous material layer that extends across the entire area of the second-conductivity-type semiconductor material layer 136L. The thickness of the transparent conductive oxide layer 38 may be in a range from 100 nm to 2 microns, such as from 200 nm to 1 micron, although lesser and greater thicknesses may also be employed. Alternatively, the transparent conductive oxide layer 38L may be replaced with a silver or aluminum layer, which may be deposited by physical vapor deposition and annealed to provide a contact to a p-type semiconductor material. In this case, the silver or aluminum layer may function as a reflector material layer and subsequent deposition of a reflector material layer may be omitted.

Figure 2:
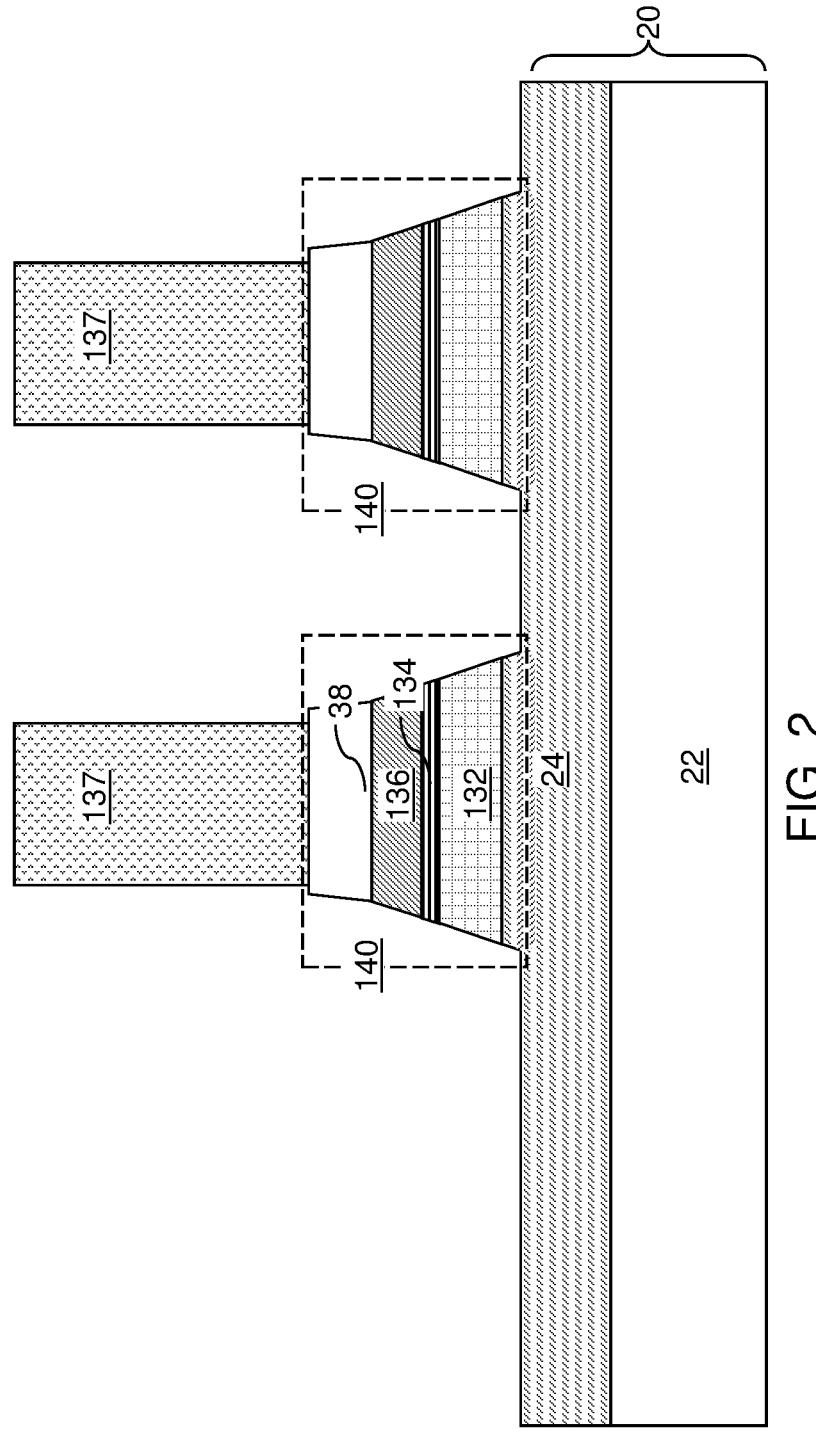
FIG. 2 is a vertical cross-sectional view of a further intermediate structure that may be used in the formation of planar LED structures, according to various embodiments.

FIG. 2 is a vertical cross-sectional view of a further intermediate structure 200 that may be used in the formation of planar LED structures, according to various embodiments. The intermediate structure 200 may be formed from the intermediate structure 100 of FIG. 1, by applying a photoresist layer over the layer stack and lithographically patterning the photoresist layer to form a patterned photoresist layer 137. The patterned photoresist layer 137 may include discrete portions that cover a respective area of the layer stack such that the covered areas are laterally spaced among one another. In one embodiment, the discrete portions of the patterned photoresist layer 137 may be arranged as a two-dimensional array or a one-dimensional array. In one embodiment, the discrete portions of the patterned photoresist layer 137 may be arranged as a two-dimensional periodic array or a one-dimensional periodic array. The horizontal cross-sectional shape of each discrete portion of the patterned photoresist layer 137 may be circular, elliptical, polygonal, of a rounded polygonal shape, or of any generally two-dimensional closed curvilinear shape having a periphery.

An etch process may be performed to etch unmasked portions of the layer stack above the buffer layer 24. The etch process may include, and/or may consist of, at least one isotropic wet etch step in case the lateral dimension of each patterned portion of the patterned photoresist layer 137 is greater than the total thickness of the layer stack, for example, by a factor of 1.5 or more. Alternatively or additionally, the etch process may include, and/or may consist of, at least one anisotropic etch step (such as at least one reactive ion etch process). In one embodiment, the etch process may include a plurality of anisotropic etch steps that sequentially etches two or more of the various material layers within the layer stack. In one embodiment, the etch process may consist of a single anisotropic etch process that includes a plurality of anisotropic etch steps that are sequentially performed to etch through each layer of the layer stack until a top surface of the buffer layer 24 is physically exposed.

Portions of the layer stack that are not masked by the patterned photoresist layer 137 are etched by the etch process. Remaining patterned portions of the layer stack (and any patterned upper portions of the buffer layer 24) may include mesa structures 140. Specifically, each contiguous set of remaining portions of the layer stack and optionally an underlying patterned portion of the buffer layer 24 that underlies a respective discrete portion of the patterned photoresist layer 137 constitutes a mesa structure 140. Each mesa structure 140 has a top surface that contacts a bottom surface of an overlying portion of the patterned photoresist layer 137. Each mesa structure 140 has at least one sidewall that continuously extends from the top surface to an optionally recessed horizontal surface of the buffer layer 24. Generally, the mesa structures 140 may have shapes of frustums or cylinders with variable, or uniform, horizontal cross-sectional shapes. Each sidewall of the mesa structures 140 may be vertical, or may have a taper angle with respect to a vertical direction (which is perpendicular to the interfaces between the various layers within the layer stack. The taper angle may be in a range from 0 degree to 50 degrees, such as from 0 degrees to 30 degrees. The maximum lateral dimension of the top surface of each mesa structure 140 may be in a range from 100 nm to 5 microns, such as 0.5 to 3 microns, for example 1 to 2 microns, although lesser and greater dimensions may also be employed. In one embodiment, the top surface of each mesa structure 140 is narrower than the bottom surface of the mesa structure 140.

Each mesa structure 140 may be formed over the buffer layer 24 (which may be the a doped compound semiconductor layer). Each mesa structure 140 may include, from bottom to top, a first-conductivity-type compound semiconductor layer 132, an active layer stack 134 configured to emit light at a peak wavelength, a second-conductivity-type compound semiconductor layer 136, and a transparent conductive oxide layer 38. Each first-conductivity-type compound semiconductor layer 132 includes a patterned portion of the continuous first-conductivity-type semiconductor material layer 132L. Each active layer stack 134 includes a patterned portion of the continuous active layer 134L. Each second-conductivity-type compound semiconductor layer 136 includes a patterned portion of the continuous second-conductivity-type semiconductor material layer 136L. Each transparent conductive oxide layer 38 includes a patterned portion of the continuous transparent conductive oxide layer 38L. Each layer within a mesa structure 140 may be formed as a planar layer having a uniform thickness throughout and having a respective horizontal top surface and a respective horizontal bottom surface. The photoresist layer 137 may be subsequently removed, for example, by ashing.

Figure 3:
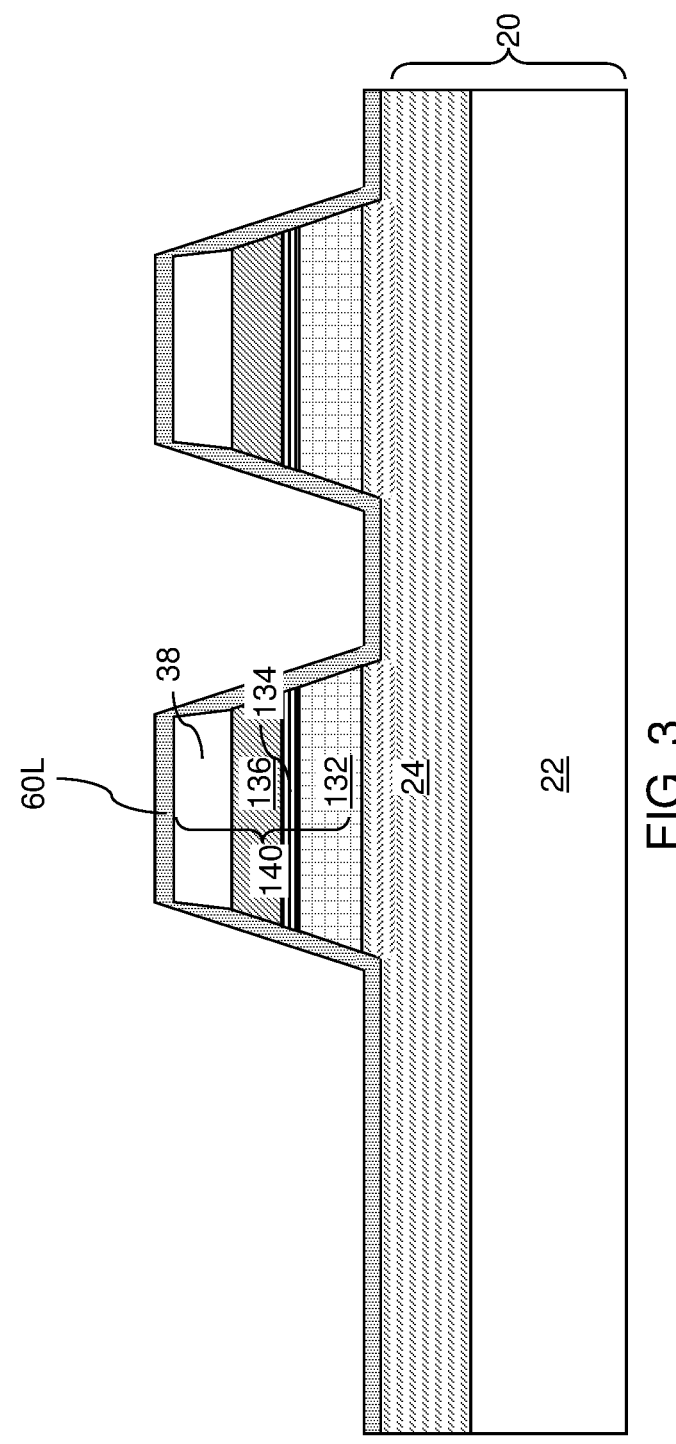
FIG. 3 is a vertical cross-sectional view of a further intermediate structure that may be used in the formation of planar LED structures, according to various embodiments.

FIG. 3 is a vertical cross-sectional view of a further intermediate structure 300 that may be used in the formation of planar LED structures, according to various embodiments. As shown in FIG. 3, a continuous passivation material layer 60L is formed over the mesa structures 140 and over the physically exposed horizontal surface of the buffer layer 24. The passivation material layer 60L may be deposited by metal organic chemical vapor deposition (MOCVD), atomic layer deposition (ALD) or another suitable deposition method.

The passivation material layer 60L may be formed over the mesa structure 140. The passivation material layer 60L may include a first horizontally extending portion that overlies a transparent conductive oxide layer 38, sidewall (i.e., non-horizontal) portions that contact the sidewalls of the metal structure 140 and laterally surround the mesa structure 140, and a second horizontal portion located outside an area of the mesa 140, overlying the top surface of the buffer layer 24, and adjoined to the sidewall portions of the passivation material layer 60L. The sidewall portions of the passivation material layer 60L are adjoined to the periphery of the first and second horizontally extending portions of the passivation material layer 60L. The thickness of the passivation material layer 60L, may be in a range from 100 nm to 4 microns, such as from 200 nm to 2 microns, although lesser and greater thicknesses may also be employed.

The external quantum efficiency (EQE) of LED structures tends to decrease with decreasing size of the LED structures. The decrease may be significant in LED structures that have an area comparable or less than 50×50 square microns. This trend of decreasing EQE with decreasing LED size has been observed in a variety of material systems including AlInGaP and InGaN.

The decrease of EQE with LED size may be due to a corresponding increase in a ratio of sidewall area to emitting area as LED size is decreased. Further, the process of etching the intermediate structure 100 to generate the mesa structures 140 of FIG. 2 may generate dangling bonds that act as non-radiative recombination sites. Such dangling bonds may thereby allow a certain fraction of injected carriers to recombine without emitting light, which in turn reduces the EQE of the LED structure.

The present inventor realized that material of passivation material layer 60L may have an impact on the external quantum efficiency (EQE) of the LED structures. Thus, the embodiments of the present disclosure utilize a material for the passivation material layer 60L that matches the crystal structure of the underlying LED, such as the material of the sidewall(s) of the mesa structure 140. As such, a presence of dangling bonds, which may otherwise act as non-radiative recombination sites, may be reduced and thus provide LED structures that exhibit an increased EQE.

If the semiconductor layers 132, 134 and 136 of the mesa structure 140 include a Group III-nitride semiconductor material, then the passivation material layer 60L may also comprise a Group III-nitride material which matches the lattice (i.e., crystal) structure of the semiconductor layers of the mesa structure 140. For example, if the layers 132, 134 and 136 of the mesa structure 140 comprise GaN, InGaN, and/or AlGaN, then the material of the passivation material layer 60L may comprise AlN, GaN, InN, or any other material which matches the crystal structure of GaN, InGaN or AlGaN. Such III-nitride materials may be deposited by ALD, MOCVD, or by other techniques that allow the passivation material layer 60L to essentially match the structure of the underlying LED mesa structure 140 that includes a GaN-based material system.

The passivation material layer 60L may comprise a semiconductor material or an insulating material. For example, AlN may be considered a very wide band gap semiconductor material or an insulating material. If the passivation material layer 60L comprises a semiconductor material, then it has an electrical conductivity that is at least two orders of magnitude lower than the conductivity of the doped semiconductor layers 132 and 136 of the mesa structure 140 to avoid shorting the p-n or p-i-n junction in the mesa structure. For example, the passivation material layer 60L may comprise an undoped (i.e., intrinsic) semiconductor layer or a semiconductor material that has a p-type or n-type dopant concentration that is at least two orders of magnitude lower than that of the doped semiconductor layers 132 and 136.

The above-described materials (e.g., AlN, GaN, InN), which may be used for the passivation material layer 60L, have a similar structure (e.g., hexagonal symmetry) and a lattice constant that is similar to that of the underlying GaN-based semiconductor layers of the mesa structures 140. The close similarity between the passivation material layer 60L and the underlying material may generate a more complete passivation of dangling bonds generated by etching of the mesa structures 140. The resulting LED structures may exhibit a higher EQE relative to un-passivated LED structures or LED structures that are passivated with materials that do not sufficiently match the underlying GaN-based LED structure. The use of such materials for the passivation material layer 60L may thereby mitigate the reduction of EQE with decreasing LED size described above.

Other embodiments may include LED structures that may be passivated by materials having a similar crystal structure to that of the underlying LED mesa structure. For example, the LED mesa structure 140 may be formed with a III-phosphide semiconductor layers, such as GaP, InGaP, AlGaP and/or AlInGaP material that has a zinc blende crystal structure. For such LED structures, the passivation material layer 60L may be chosen to also have a zinc blende structure. For example, an III-phosphide based LED mesa structure 140 may be passivated with ZnS, GaAs, GaP, or other similar materials having a zinc blende structure and comparable lattice constant. Such passivating materials may be deposited by ALD, MOCVD, or other deposition techniques that allow the passivating material to sufficiently match the structure of the underlying LED structures.

Therefore, as used herein, lattice (i.e., crystal) structures of the passivation material layer 60L and the doped semiconductor layers of the mesa structure 140 are considered to match if they are of the same type or have the same classification. Thus, a hexagonal lattice structure of Group III-nitride material of the passivation material layer 60L matches the hexagonal lattice structure of the GaN-based doped semiconductor layers of the mesa structure 140. Likewise, a zinc blende lattice structure of ZnS, GaAs or GaP passivation material layer 60L matches the zinc blende lattice structure of the doped Group III-phosphide semiconductor layers of the mesa structure 140.

Figure 4:
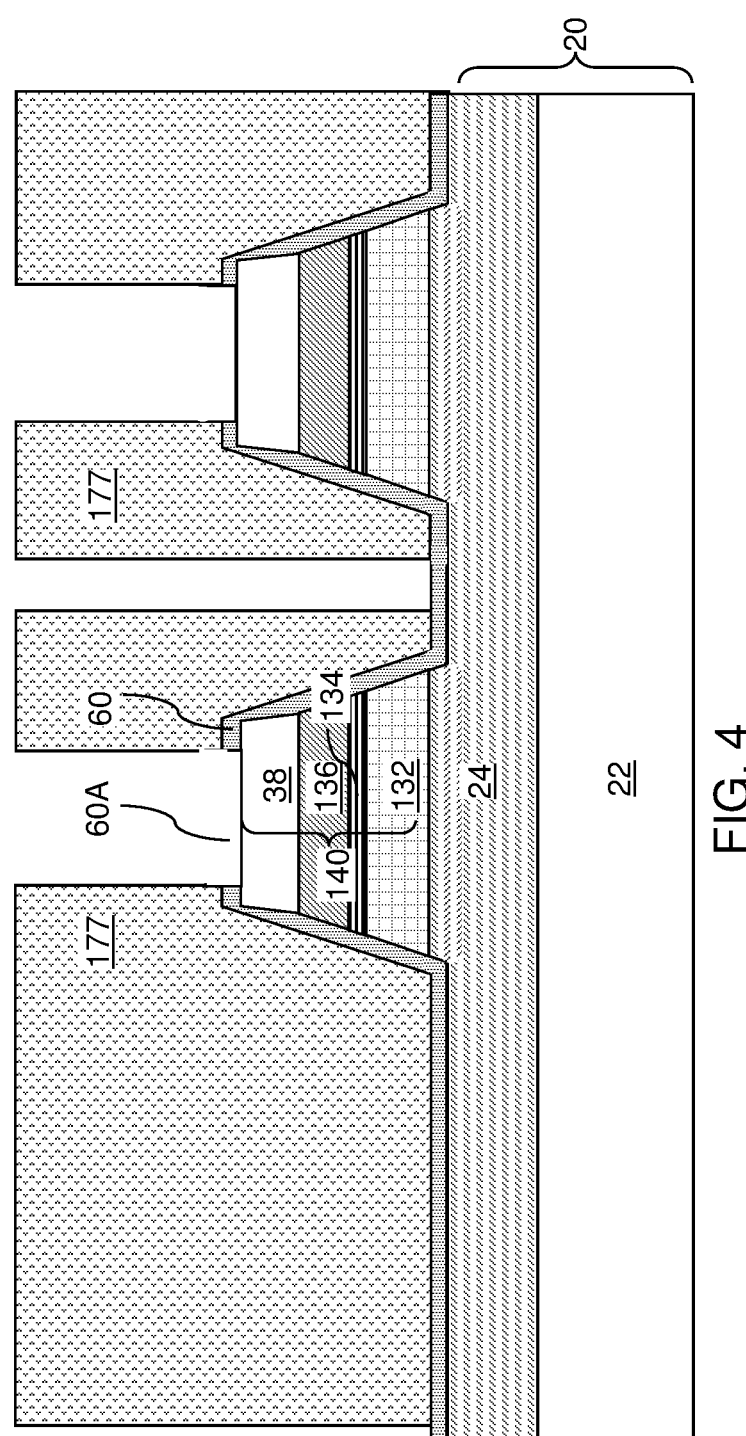
FIG. 4 is a vertical cross-sectional view of a further intermediate structure that may be used in the formation of planar LED structures, according to various embodiments.

FIG. 4 is a vertical cross-sectional view of a further intermediate structure 400 that may be used in the formation of planar LED structures, according to various embodiments. As shown in FIG. 4, a photoresist layer 177 may be applied over the continuous passivation material layer 60L, and may be lithographically patterned to form discrete patterned photoresist material portions having a respective opening therethrough above an underlying mesa structure 140. An etch process may be performed to etch unmasked portions of the continuous passivation material layer 60L employing the photoresist layer 177 as an etch mask to form openings 60A in the passivation material layer 60L exposing the top of the transparent conductive oxide layer 38 at the top of each mesa structure 140. The etch process may include an anisotropic etch process and/or an isotropic etch process. Each patterned portion of the continuous passivation material layer 60L constitutes a passivation material layer 60. The opening 60A is located in the passivation material layer 60 over a center region of a respective underlying mesa structure 140. The photoresist layer 177 portions are removed by any suitable method, such as ashing.

Figure 5:
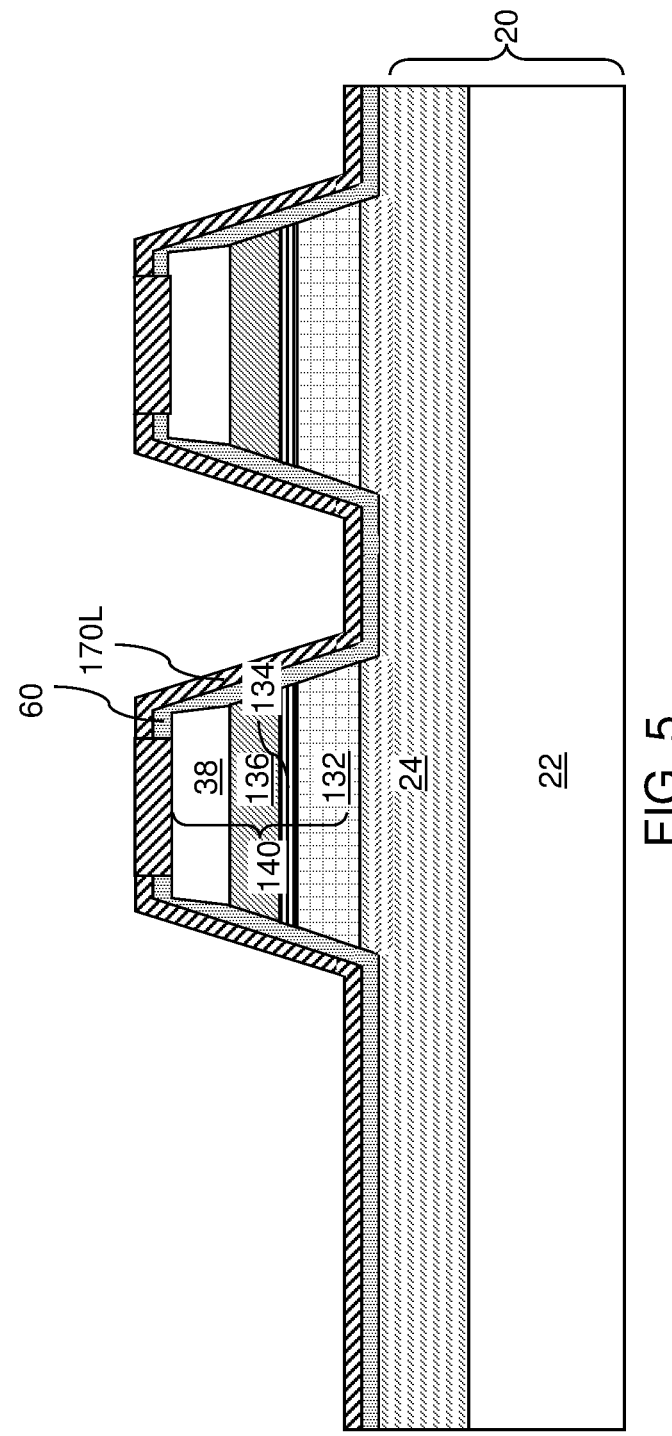
FIG. 5 is a vertical cross-sectional view of a further intermediate structure that may be used in the formation of planar LED structures, according to various embodiments.

FIG. 5 is a vertical cross-sectional view of a further intermediate structure 500 that may be used in the formation of planar LED structures, according to various embodiments. As shown in FIG. 5, a continuous reflector layer 170L is formed over the passivation material layer 60. The continuous reflector layer 170L may be deposited by a directional deposition method, such as vacuum evaporation or physical vapor deposition. The continuous reflector layer 170L may be a metal. In one embodiment, the continuous reflector layer 170L includes at least one material selected from silver, aluminum, copper, or gold. In one embodiment, the reflector material may be a thin film distributed Bragg reflector (DBR) with small index changes to provide better reflectivity. The reflector material may include at least one conductive material and/or at least one electrically insulating material. The thickness of the reflector layer 170L may be in a range from 5 nm to 500 nm, such as from 10 nm to 250 nm, although lesser and greater thicknesses may also be employed. A portion of the continuous reflector layer 170L at least partially fills the opening 60A is located in the passivation material layer 60 to electrically contact the transparent conductive oxide layer 38.

Figure 6:
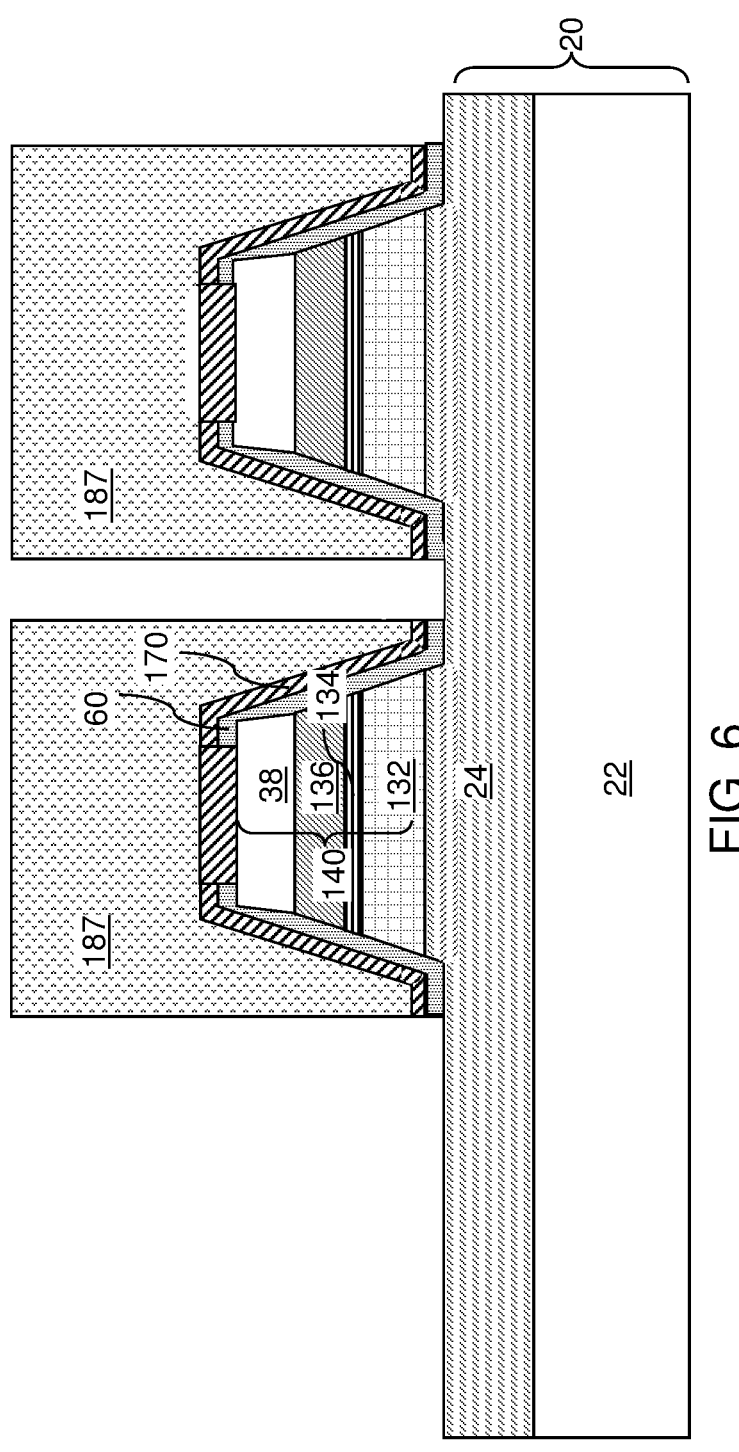
FIG. 6 is a vertical cross-sectional view of a further intermediate structure that may be used in the formation of planar LED structures, according to various embodiments.

FIG. 6 is a vertical cross-sectional view of a further intermediate structure 600 that may be used in the formation of planar LED structures, according to various embodiments. As shown in FIG. 6, a photoresist layer 187 may be applied over the continuous reflector layer 170L, and may be lithographically patterned to form discrete patterned photoresist material portions covering an underlying mesa structure 140. The area defined by the outer periphery of a discrete patterned photoresist material portion covers the entire area of an underlying mesa structure 140 and may laterally extend past the edge of each underlying mesa structure 140. Regions of the continuous reflector layer 170L located between adjacent mesa structures 140 are exposed between the discrete patterned photoresist material portions. The exposed portions of the continuous reflector layer 170L are removed by isotropic and/or anisotropic etching using photoresist layer 187 portions as an etch mask. Each patterned portion of the continuous reflector layer 170L constitutes a reflector layer 70. Portions of the passivation material layer 60 that are exposed between each reflector layer 70 may also be optionally removed by etching. The photoresist layer 187 portions are removed by any suitable method, such as ashing.

Each stack of a passivation material layer 60 and a reflector layer 170 may overlie only one mesa structure 140, and may be laterally spaced apart from neighboring stacks of a passivation material layer 60 and a reflector layer 170. In one embodiment, a bottom horizontal portion of each passivation material layer 60 may include a horizontal top surface and a horizontal bottom surface, and may contact a top surface of the buffer layer 24. In one embodiment, an anisotropic etch process may be employed to pattern the continuous reflector layer 170L and the passivation material layer 60. In one embodiment, each reflector layer 170 may have an inner sidewall that overlies a respective mesa structure 140. In one embodiment, each reflector layer 170 may have an outer sidewall that is located outside an area of the mesa structure 140, and is vertically coincident with an outer sidewall of the bottom horizontal portion of a passivation material layer 60 that underlies the reflector layer 170. Each passivation material layer 60 may laterally surround a respective mesa structure 140, and may contact each sidewall of the layers within the respective mesa structure 140. In one embodiment, each passivation material layer 60 may include an upper portion that overlies a peripheral region of the top surface of a respective mesa structure 140.

Figure 7:
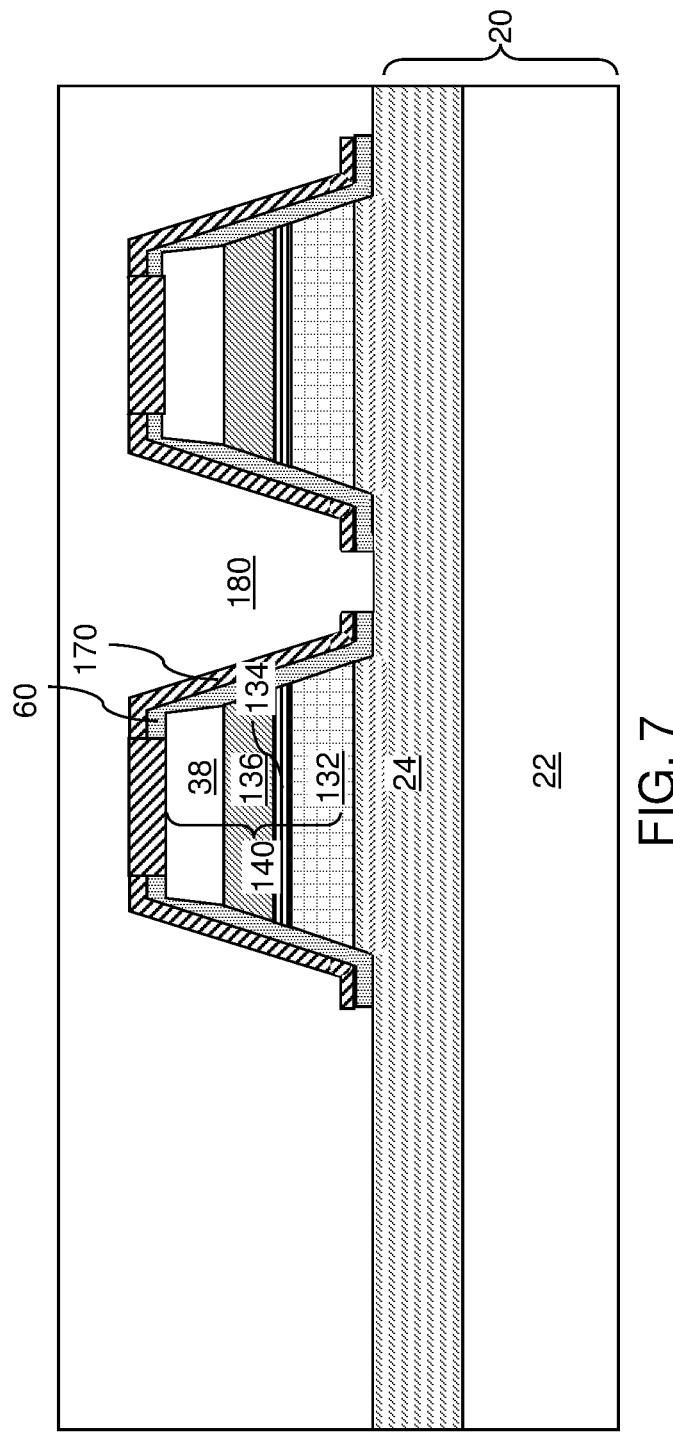
FIG. 7 is a vertical cross-sectional view of a further intermediate structure that may be used in the formation of planar LED structures, according to various embodiments.

FIG. 7 is a vertical cross-sectional view of a further intermediate structure 700 that may be used in the formation of planar LED structures, according to various embodiments. As shown in FIG. 7, a dielectric matrix layer 180 may be formed around the mesa structures 140 and the stacks of a passivation material layer 60 and a reflector layer 170. The dielectric matrix layer 180 may include a planarizable passivation material such as an organic polymer or silicon oxide, or may include a self-planarizing passivation material such as flowable oxide (FOX). In case the dielectric matrix layer 180 includes a planarizable dielectric material, a chemical mechanical polishing (CMP) process may be performed to provide a planar top surface that is vertically spaced from topmost surfaces of the reflector layers 170 and the mesa structures 140. In case the dielectric matrix layer 180 is formed by application of a self-planarizing dielectric material, the thickness of the applied dielectric material may be adjusted so that the top surface of the dielectric matrix layer 180 overlies the top surfaces of the reflector layers 170 and the mesa structures 140.

Figure 8:
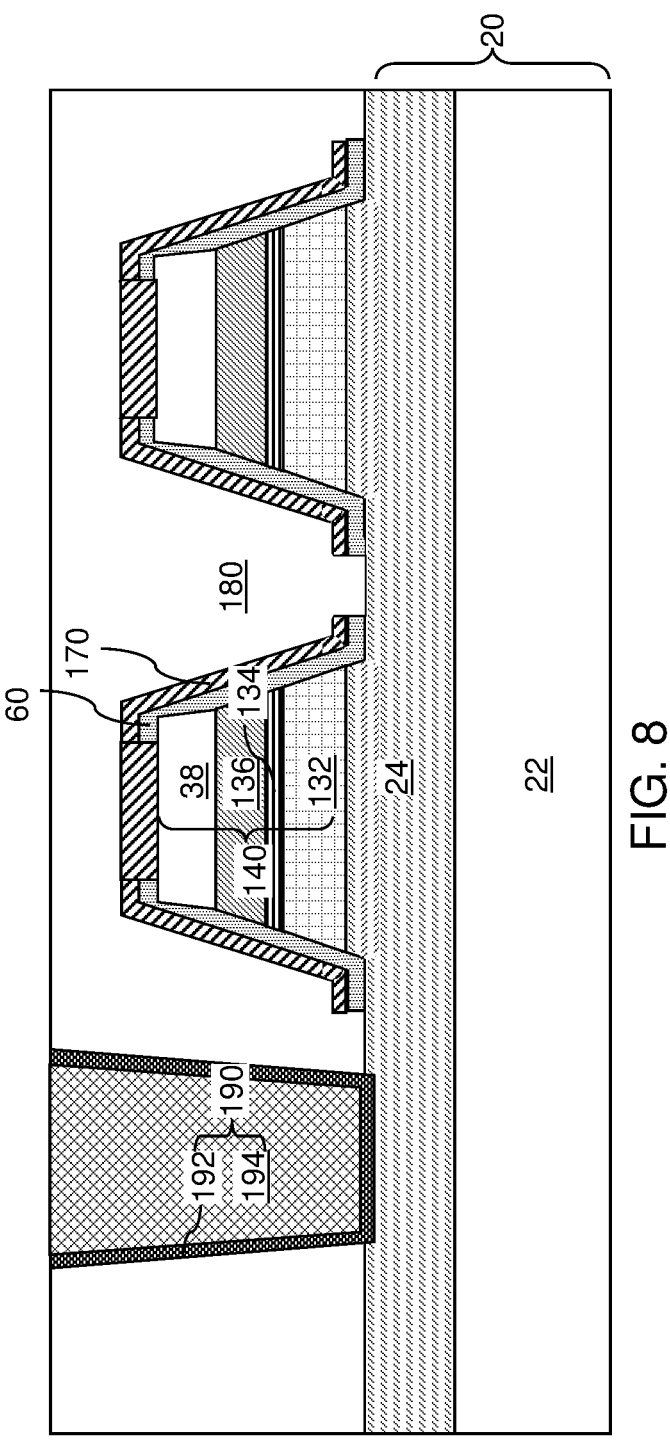
FIG. 8 is a vertical cross-sectional view of a further intermediate structure that may be used in the formation of planar LED structures, according to various embodiments.

FIG. 8 is a vertical cross-sectional view of a further intermediate structure 800 that may be used in the formation of planar LED structures, according to various embodiments. As shown in FIG. 8, a via cavity may be formed through the dielectric matrix layer 180. For example, a photoresist layer (not shown) may be applied over the dielectric matrix layer 180, and may be lithographically patterned to form an opening therethrough. An anisotropic etch process may be performed to etch through the dielectric matrix layer 180 until a surface of the buffer layer 24 is physically exposed to form the via cavity. A plurality of via cavities may be formed such that each light emitting diode to be subsequently formed has a respective contact via structure. The photoresist layer may be subsequently removed, for example, by ashing.

At least one conductive material may be deposited in each via cavity. The at least one conductive material may include, for example, a metallic liner material such as TiN, TaN, or WN and a metallic fill material such as W, Cu, Mo, Al, Ag, Co, Au, Ni, Sn, other elemental metals, and/or alloys or combinations thereof. A CMP process and/or a selective recess etch may be performed to remove portions of the at least one conductive material from above the top surface of the dielectric matrix layer 180. A contact via structure 190 is formed within each via cavity. Each contact via structure 190 may include a metallic liner 192 that includes a remaining portion of the metallic liner material and a metallic fill material portion 194 that includes a remaining portion of the metallic fill material. Each contact via structure 190 vertically extends through the dielectric matrix layer 180 and contacts the buffer layer 24.

Figure 9:
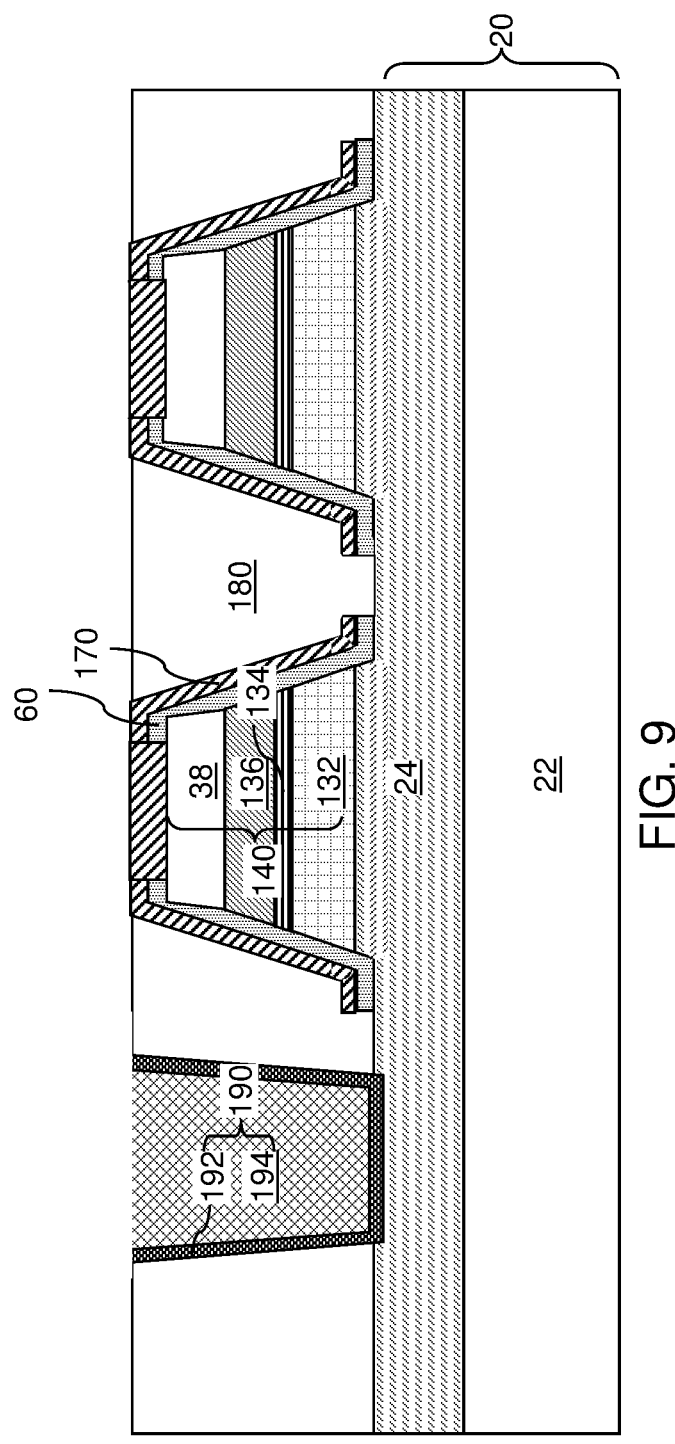
FIG. 9 is a vertical cross-sectional view of a further intermediate structure that may be used in the formation of planar LED structures, according to various embodiments.

FIG. 9 is a vertical cross-sectional view of a further intermediate structure 900 that may be used in the formation of planar LED structures, according to various embodiments. As shown in FIG. 9, the top surface of the dielectric matrix layer 180 and the contact via structure 190 may be vertically recessed by a CMP process and/or an etch process, to expose the upper surface of the reflector layers 170 located over each mesa structure 140. For example, the same or different CMP process from the CMP process shown in FIG. 8 may be used in this step.

Figure 10:
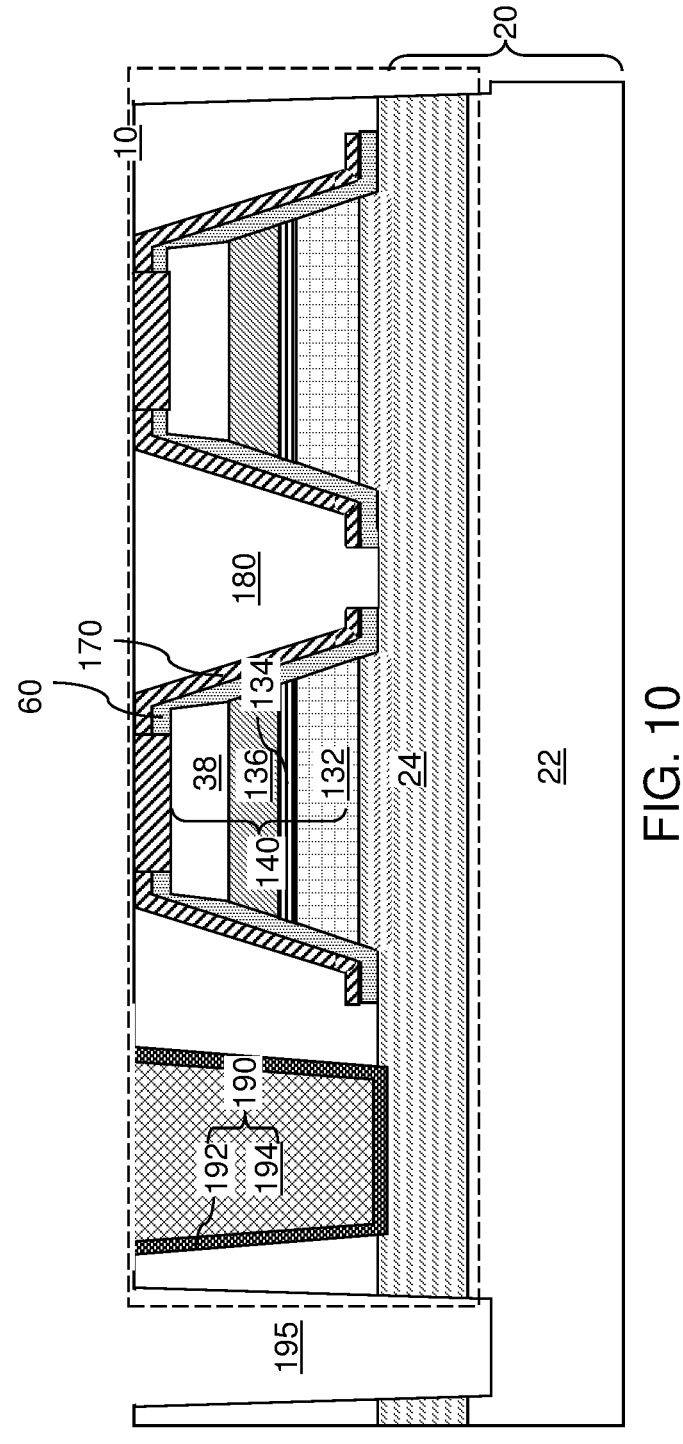
FIG. 10 is a vertical cross-sectional view of a further intermediate structure that may be used in the formation of planar LED structures, according to various embodiments.

FIG. 10 is a vertical cross-sectional view of a further intermediate structure 1000 that may be used in the formation of planar LED structures, according to various embodiments. As shown in FIG. 10, isolation trenches 195 may be formed through the dielectric matrix layer 180, the buffer layer 24, and optionally into an upper portion of the support substrate 22. For example, a photoresist layer (not shown) may be applied over the dielectric matrix layer 180, and may be lithographically patterned to form openings between each neighboring pair of light emitting diodes 10. An anisotropic etch process may be performed to etch through portions of the dielectric matrix layer 180 and the buffer layer 24 that are not masked by the patterned photoresist layer. The isolation trenches 195 may be formed as channels that laterally separate neighboring pairs of light emitting diodes 10. Each light emitting diode 10 may contain one or more mesa structures 140, such as two or more, such as two to ten mesa structures 140, and at least one contact via structure 190. Thus, either plural mesas 140 or only one mesa 140 may be located between adjacent isolation trenches 195. Optionally, the light emitting diodes 10 may be singulated, for example, by scribing. Alternatively, the combination of the support substrate 22 and the light emitting diodes 10 may be retained as a unit structure.

Figure 11:
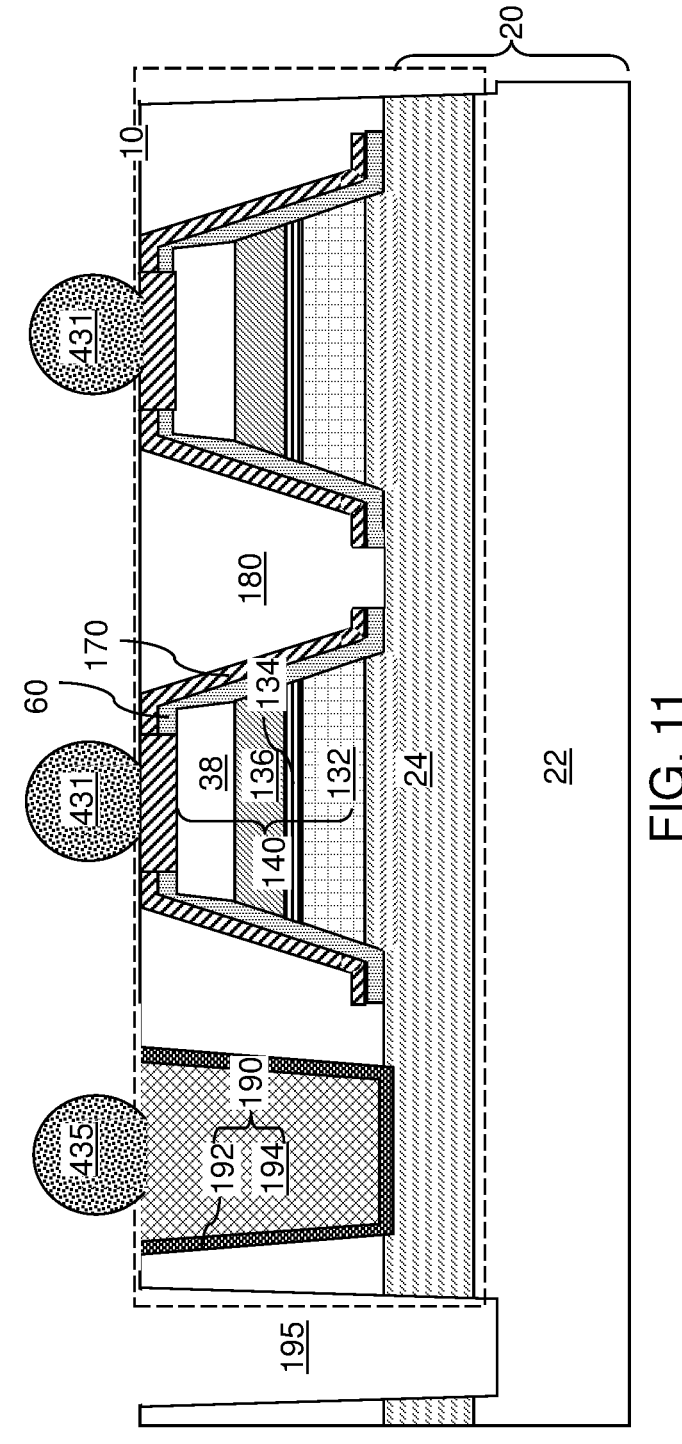
FIG. 11 is a vertical cross-sectional view of a further intermediate structure that may be used in the formation of planar LED structures, according to various embodiments.

FIG. 11 is a vertical cross-sectional view of a further intermediate structure 1100 that may be used in the formation of planar LED structures, according to various embodiments. As shown in FIG. 11, conductive bonding structures (431, 435) may be formed on the reflector layers 170 and the contact via structures 190. The conductive bonding structures (431, 435) may include first conductive bonding structures 431 that are formed in electrical contact with to a respective one of the reflector layers 170, and second conductive bonding structures 435 that are formed in electrical contact with a respective one of the contact via structures 190. The conductive bonding structures (431, 435) may include a solder material, which may include tin, and optionally includes an alloy of tin and silver, gold, copper, bismuth, indium, zinc, and/or antimony. It is understood that shape of the conductive bonding structures (431, 435) as illustrated is only schematic, and may not represent a true shape of conductive bonding structures (431, 435). The conductive bonding structures may be 2 to 10 microns thick, such as 5 to 7 microns thick.

Figure 12:
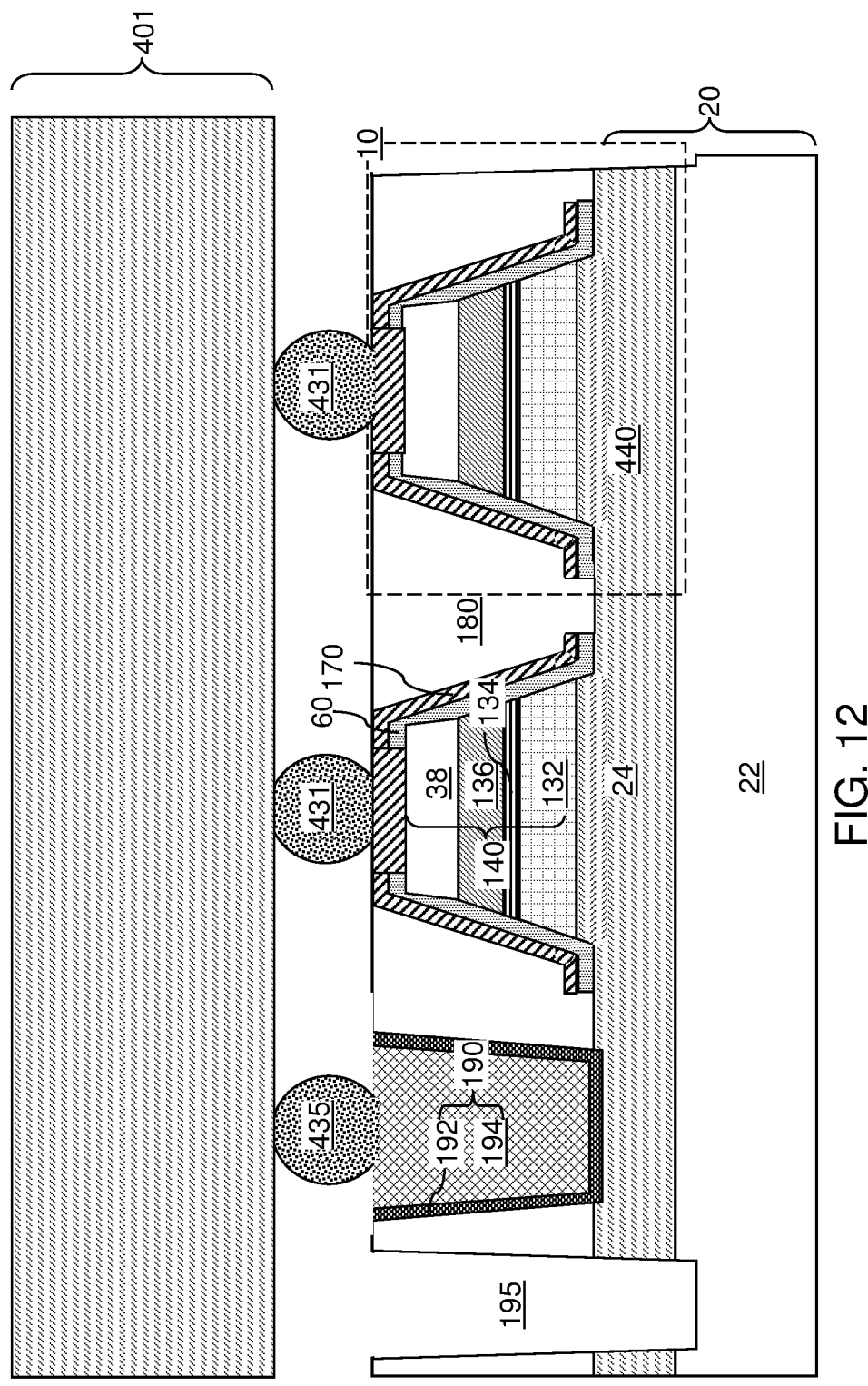
FIG. 12 is a vertical cross-sectional view of a planar LED structure, according to various embodiments.

FIG. 12 is a vertical cross-sectional view of a planar LED structure 1200, according to various embodiments. As shown in FIG. 12, the conductive bonding structures (431, 435) may be attached (i.e., bonded) to a backplane 401. A backplane may be an active or passive matrix backplane substrate for driving LEDs. As used herein, a "backplane substrate" refers to any substrate configured to affix multiple devices thereupon. The backplane 401 contains a backplane substrate. The backplane substrate is a substrate onto which various devices (e.g., LEDs) may be subsequently transferred.

In one embodiment, the backplane 401 may include a substrate including silicon, glass, plastic, and/or at least other material that may provide structural support to the devices to be subsequently transferred thereupon. In one embodiment, the backplane substrate may be a passive backplane substrate, in which metal interconnect structures (not shown) including metallization lines are present, for example, in a crisscross grid and active device circuits are not present. In another embodiment, the backplane substrate may be an active backplane substrate, which includes metal interconnect structures as a crisscross grid of conductive lines and further includes a device circuitry at one or more intersections of the crisscross grid of conductive lines. The device circuitry may include one or more transistors.

The conductive bonding structures (431, 435) may be bonded to bonding pads or to bonding structures (e.g., solder balls) located on the backplane. Each light emitting diode 10 may emit the same color light (e.g., have the same peak emission wavelength) or different color light (e.g., have different peak emission wavelengths). For example, the LEDs 10 may emit one of red, green or blue light to form an RGB display. Alternatively, a color conversion medium, such as quantum dots, phosphor or dye may be provided between each LED 10 and the observer. In this case, each LED 10 may emit the same color light (e.g., blue light or UV radiation), and the color conversion medium may comprise red, green and optionally blue (for UV emitting LEDs) color conversion medium to form the RGB display.

Plural light emitting diodes 10 formed on separate support substrates 22 may be electrically connected to the backplane to form a multicolor direct view display device. If desired, the support substrate 22 may be removed after bonding the light emitting diode 10 to the backplane 401 or the support substrate 22 may be retained in the final light emitting device.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting diode, comprising:
a mesa structure comprising a first-conductivity-type compound semiconductor layer, an active layer stack configured to emit light at a peak wavelength, and a second-conductivity-type compound semiconductor layer; and
a passivation material layer contacting at least a sidewall of the mesa structure, wherein the passivation material layer comprises a first crystal structure that matches a second crystal structure of the first-conductivity-type compound semiconductor layer and the second-conductivity-type compound semiconductor layer,
wherein the first-conductivity-type compound semiconductor layer and the second-conductivity-type compound semiconductor layer comprise phosphorous, and
wherein the passivation material layer comprises ZnS, GaAs or GaP.

2. The light emitting diode of claim 1, wherein the first-conductivity-type compound semiconductor layer and the second-conductivity-type compound semiconductor layer each comprise doped Group III-phosphide material.

3. The light emitting diode of claim 1, further comprising:
a doped compound semiconductor layer located between a substrate and the first-conductivity-type compound semiconductor layer; and
a transparent conductive layer located over the second-conductivity-type compound semiconductor layer.

4. The light emitting diode of claim 3, wherein the passivation material layer laterally surrounds the mesa structure and comprises:
an upper horizontal portion that overlies a peripheral region of a top side of the mesa structure;
a bottom horizontal portion which contacts a top surface of the doped compound semiconductor layer; and
a sidewall portion which contacts the sidewall of the mesa structure and is adjoined to a periphery of the upper and lower horizontal portions.

5. The light emitting diode of claim 4, wherein:
the upper horizontal portion is located above the transparent conductive layer; and an opening in the upper horizontal portion is located over a center region of the mesa structure and exposes the transparent conductive layer.

6. The light emitting diode of claim 5, further comprising a reflector layer laterally surrounding and contacting an outer surface of the sidewall portion of the passivation material layer, wherein the reflector layer electrically contacts the transparent conductive layer through the opening.

7. The light emitting diode of claim 6, further comprising:
a first conductive bonding structure overlying and electrically connected to the transparent conductive layer
a dielectric matrix layer laterally surrounding the passivation material layer;
a contact via structure vertically extending through the dielectric matrix layer and electrically contacting the doped compound semiconductor layer;
a second conductive bonding structure overlying and electrically connected to the contact via structure; and
a backplane electrically connected to the first conductive bonding structure and the second conductive bonding structure.

8. The light emitting diode according to claim 1, wherein the first crystal structure and the second crystal structure are a zinc blende crystal structure.

9. A method of forming a light emitting diode, comprising:
forming a first-conductivity-type compound semiconductor layer, an active layer stack configured to emit light at a peak wavelength, and a second-conductivity-type compound semiconductor layer over a substrate;
forming a mesa structure by etching the first-conductivity-type compound
semiconductor layer, the active layer stack and the second-conductivity-type compound semiconductor layer; and
forming a passivation material layer in contact with at least a sidewall of the mesa structure, wherein the passivation material layer comprises a first crystal structure that matches a second crystal structure of the first-conductivity-type compound semiconductor layer and the second-conductivity-type compound semiconductor layer,
wherein the first-conductivity-type compound semiconductor layer and the second-conductivity-type compound semiconductor layer comprise phosphorous, and
wherein the passivation material layer comprises ZnS, GaAs or GaP.

10. The method of claim 9, wherein the first-conductivity-type compound semiconductor layer and the second-conductivity-type compound semiconductor layer each comprise doped Group III-phosphide material.

11. The method of claim 9, further comprising:
forming a transparent conductive oxide layer over the second-conductivity-type compound semiconductor layer prior to forming the passivation material layer;
forming an opening through the upper portion of the passivation material layer over a center region of the mesa structure to expose the transparent conductive oxide layer;
forming a continuous reflector layer over the passivation material layer and in the opening such that the continuous reflector layer is electrically connected to the transparent conductive oxide layer; and
patterning the continuous reflector layer to form a reflector layer that laterally surrounds the mesa structure and the passivation material layer.

12. The method of claim 11, wherein the passivation material layer laterally surrounds the mesa structure and comprises:
an upper horizontal portion that overlies a peripheral region of a top side of the mesa structure;
a bottom horizontal portion which contacts a top surface of the doped compound semiconductor layer; and
a sidewall portion which contacts the sidewall of the mesa structure and is adjoined to a periphery of the upper and lower horizontal portions.

13. The method of claim 11, further comprising forming a first conductive bonding structure on a physically exposed surface of the reflector layer.

14. The method of claim 13, further comprising:
forming a dielectric matrix layer laterally surrounding the passivation material layer;
forming a contact via structure vertically extending through the dielectric matrix layer and contacting a doped compound semiconductor layer located between the substrate and the first-conductivity-type compound semiconductor layer;

forming a second conductive bonding structure overlying and electrically connected to the contact via structure; and electrically contacting the first conductive bonding structure and the second conductive bonding structure to a backplane.

15. The method according to claim 9, wherein the first crystal structure and the second crystal structure are a zinc blende crystal structure.

16. A light emitting diode, comprising:

a mesa structure comprising a first-conductivity-type compound semiconductor layer, an active layer stack configured to emit light at a peak wavelength, and a second-conductivity-type compound semiconductor layer; and a passivation material layer contacting at least a sidewall of the mesa structure, wherein the passivation material layer comprises a first crystal structure that matches a second crystal structure of the first-conductivity-type compound semiconductor layer and the second-conductivity-type compound semiconductor layer, wherein the passivation material layer comprises ZnS, GaAs or GaP.

\* \* \* \* \*